(12) United States Patent
Vanchev et al.

(10) Patent No.: US 10,439,860 B2
(45) Date of Patent: Oct. 8, 2019

(54) INSTALLATION LOCATION NOISE FLOOR EVALUATION DEVICE

(71) Applicant: AT&T Digital Life, Inc., Atlanta, GA (US)

(72) Inventors: Plamen Vanchev, Suwanee, GA (US); Bashar Abdul-Majeed, Marietta, GA (US)

(73) Assignee: AT&T Digital Life, Inc., Atlanta, GA (US)

( * ) Notice: Subject to any disclaimer, the term of this patent is extended or adjusted under 35 U.S.C. 154(b) by 89 days.

(21) Appl. No.: 15/287,269

(22) Filed: Oct. 6, 2016

(65) Prior Publication Data

US 2018/0102932 A1 Apr. 12, 2018

(51) Int. Cl.
| | |
|---|---|
| *H04B 1/3827* | (2015.01) |
| *H04L 27/26* | (2006.01) |
| *H04M 1/725* | (2006.01) |
| *H04B 17/10* | (2015.01) |
| *H04W 24/02* | (2009.01) |
| *H04W 84/12* | (2009.01) |
| *H04W 84/04* | (2009.01) |

(Continued)

(52) U.S. Cl.
CPC ....... *H04L 27/2688* (2013.01); *H04B 1/3838* (2013.01); *H04B 17/101* (2015.01); *H04M 1/7258* (2013.01); *H04W 24/02* (2013.01); *H01J 37/266* (2013.01); *H01L 27/153* (2013.01); *H04W 84/042* (2013.01); *H04W 84/12* (2013.01)

(58) Field of Classification Search
CPC .. H04B 1/1027; H04B 1/3838; H04B 17/101; H04W 28/048; H04W 12/26; H04W 12/2697; H04W 24/00; H04N 21/4356; H04Q 1/2225; H01J 37/266; H01L 27/153

See application file for complete search history.

(56) References Cited

U.S. PATENT DOCUMENTS 4,034,285 A 7/1977 Ashley et al.
4,700,332 A 10/1987 Hwang
(Continued)

FOREIGN PATENT DOCUMENTS

KR 20090001750 1/2009

OTHER PUBLICATIONS

Leck, Robert, "Results of Ambient RF Environment and Noise Floor Measurements Taken in the U.S. in 2004 and 2005," World Meteorological Organization, Commission for Basic Systems Steering Group on Radio Frequency Coordination, Mar. 16-18, 2006, Geneva. (Year: 2006).*

(Continued)

*Primary Examiner* — Salvador E Rivas
(74) *Attorney, Agent, or Firm* — Hartman & Citrin LLC

(57) ABSTRACT

Concepts and technologies are disclosed herein for an installation location noise floor evaluation device. The device can be configured to receive a radio frequency signal emitted by a radio frequency device that emits a radio frequency signal that can enter into an installation location and detect a radio frequency noise floor associated with the installation location based on the radio frequency signal. The installation location noise floor evaluation device can compare the radio frequency noise floor to a noise floor threshold associated with an operating frequency of a device, generating an indication that indicates an outcome of the comparing, and output the indicator.

20 Claims, 5 Drawing Sheets

(51) Int. Cl.
  *H01L 27/15* (2006.01)
  *H01J 37/26* (2006.01)

(56) References Cited

U.S. PATENT DOCUMENTS

| | | | |
|---|---|---|---|
| 4,755,792 | A | 7/1988 | Pezzolo et al. |
| 5,564,090 | A | 10/1996 | Beauchamp et al. |
| 5,625,338 | A | 4/1997 | Pildner et al. |
| 5,950,110 | A | 9/1999 | Hendrickson |
| 6,247,353 | B1 * | 6/2001 | Battenberg ............ G01H 1/003 |
| | | | 73/40.5 A |
| 6,351,216 | B1 | 2/2002 | Frederick et al. |
| 7,091,827 | B2 | 8/2006 | Stilp |
| 7,202,784 | B1 | 4/2007 | Herwig |
| 7,495,553 | B2 | 2/2009 | Parker et al. |
| 8,010,101 | B2 | 8/2011 | Bugenhagen |
| 8,331,327 | B1 | 12/2012 | Vargantwar et al. |
| 8,456,304 | B2 | 6/2013 | van Doorn et al. |
| 8,707,458 | B2 | 4/2014 | Malaney |
| 8,831,521 | B2 | 9/2014 | Strickland et al. |
| 8,953,528 | B2 | 2/2015 | Han et al. |
| 9,069,037 | B2 | 6/2015 | Yu et al. |
| 9,112,597 | B2 | 8/2015 | Prather |
| 9,226,181 | B2 | 12/2015 | Breed |
| 2006/0139644 | A1 * | 6/2006 | Kahn .................... G01J 3/02 |
| | | | 356/406 |
| 2008/0288986 | A1 | 11/2008 | Foster et al. |
| 2011/0025453 | A1 * | 2/2011 | Kozlowski ............ G08C 17/02 |
| | | | 340/3.1 |
| 2014/0024406 | A1 * | 1/2014 | Lancaster ............ H04W 16/14 |
| | | | 455/513 |
| 2015/0029025 | A1 | 1/2015 | Kore et al. |
| 2015/0103685 | A1 | 4/2015 | Butchko et al. |

OTHER PUBLICATIONS

Agilent Technologies, "Getting Stated Guide: PSA Series Spectrum Analyzers", Nov. 2012 (Year: 2012).*
Keysight Technologies, "Keysight N9342C/43C/44C Handheld Spectrum Analyzer User Guide", Fifth Edition, Feb. 2015 (Year: 2015).*
"RF signal detector circuit", Mar. 27, 2016 (Year: 2016).*
"Room Noise Detector Circuit Schematic", Apr. 20, 2013 (Year: 2013).*
Vrablic, Mark, "Proposal: LED Color Organ", Spring 2018 (Year: 2018).*
Vrablic, Mark, "Final Project Report: LED Color Organ", Spring 2018 (Year: 2018).*
"Wi-Fi Location-Based Services 4.1 Design Guide," Chapter: Best Practices—Location-Aware WLAN Design Considerations, CISCO, Jan. 30, 2014, cisco.com.
Mcadams, Deborah D., "Eh? FCC Seeks Noise Floor," TVTechnology, Jun. 17, 2016, tvtechnology.com.
"Agilent Fundamentals of RF and Microwave Noise Figure Measurements," Application Note 57-1, Agilent Technologies, Aug. 5, 2010, Agilent Technologies, Inc.
Leck, Robert, "Results of Ambient RF Environment and Noise Floor Measurements Taken in the U.S. in 2004 and 2005," World Meteorological Organization, Commission for Basic Systems Steering Group on Radio Frequency Coordination, Mar. 16-18, 2006, Geneva.

* cited by examiner

INSTALLATION LOCATION NOISE FLOOR EVALUATION DEVICE

BACKGROUND

In the modern home and office environments, the proliferation of electronic devices in general, and radio frequency ("RF") devices in particular, has resulted in a great deal of RF noise in these environments. Because of the corresponding increase in reliance on RF signal communications (as a result of the proliferation of such devices), the increased RF noise and corresponding rise in noise floor at various locations can create challenges for implementing reliable RF-based systems and/or devices at these locations.

For example, in a busy modern downtown area of a city, access to and performance of wireless data services on various types of wide area networks (e.g., cellular data networks) and/or local wireless networks (e.g., WiFi networks) may be more difficult relative to accessing such networks in suburban and/or sparsely populated areas. This can be due to an increased demand for, and subsequent increased noise level associated with, these networks.

Some networks, however, may rely on various frequencies that, while not being as crowded as the WiFi, cellular, and/or other wireless frequencies, may be subject to jamming and/or an increasing amount of noise as well. The amount of noise therefore may fluctuate over time and location, and at any rate, reliable devices for measuring such noise may not be available due to the different radio interfaces required to sense such signals. There may be no way to know how much noise exists at a location until a device or system relying on RF signals is installed at the location and activated. Thus, a system or device may be installed at an installation location, but may not function properly after being activated due to RF noise at that location.

SUMMARY

The present disclosure is directed to an installation location noise floor evaluation device. The installation location noise floor evaluation device can enable a user or other entity to quickly, easily, and reliably measure RF noise floor at a particular installation location and clear (or not clear) an installation before the installation is attempted or completed. According to various embodiments, the installation location noise floor evaluation device can be used in specific target frequencies such as, for example, a frequency of 315 MHz, a frequency from a range of frequencies such as a 400-433 MHz frequency range, a frequency from a range of frequencies such as an 863-870 MHz frequency range (EU ISM Band), or a frequency from a range of frequencies in a 902-928 MHz frequency range (US ISM Band). According to some embodiments, a user, technician, installer, or other entity can have a device that will indicate whether or not a noise floor at a particular installation location is consistent with adequate operation of a system or device being installed at that location. The design of the installation location noise floor evaluation device can result in an inexpensive yet reliable and accurate measure of RF noise floor and comparison of the detected RF noise floor to a threshold set for a particular operating frequency of the system or device.

In practice, a user or other entity can determine that a device, system, or system component (hereinafter referred to as a "device") is being installed or otherwise located at the installation location. The device can include, according to various embodiments, a home burglar alarm system or other connected home system (e.g., a home gateway), a controller or other component thereof, or the like. The user or other entity can determine, or may be told, an operating frequency associated with one or more signals emitted by and/or received by the device. The operating frequency may have an associated noise floor threshold, or the noise floor threshold may be specified by a manual, an instruction, or the like. The operating frequency and/or noise floor threshold can be used to set (or change) an associated threshold for testing a noise floor at the installation location. In some embodiments, the installation location noise floor evaluation device can include an adjustable threshold (e.g., the user or other entity can manipulate an adjustable circuit of the installation location noise floor evaluation device) or the noise floor can have a fixed threshold and/or may be designed for only one operating frequency and/or associated noise floor threshold.

The user or other entity may press or otherwise select the switch (e.g., a button) to activate the installation location noise floor evaluation device. The installation location noise floor evaluation device can receive one or more RF signals from one or more RF devices located at or near the installation location (or at least emitting signals that can be detected at the installation location) via an antenna and/or an RF detector (e.g., a signal processor). The received and/or detected signals can be compared to a specified threshold and compliance or non-compliance with the specified threshold can be determined by the installation location noise floor evaluation device. The installation location noise floor evaluation device can output an indicator that indicates the compliance or non-compliance via a display.

If the user or other entity determines that installation of the device is proper or improper based on the indication (and optionally additionally upon other considerations), the user or other entity can relocate to another portion of the installation location if desired and continue testing until either a portion of the installation location is identified that complies with the threshold for noise floor and/or until it is determined that no portion of the installation location is identified that complies with the threshold. The device can then either be installed or not installed, based on the indication.

According to one aspect of the concepts and technologies disclosed herein, a device is disclosed. The device can include a housing, a display, an antenna, a radio frequency detector, and a processing component. The processing component can be configured to cause the device to perform operations comprising detecting a request to perform an installation location noise floor evaluation test, receiving, via the antenna, a radio frequency signal emitted by a radio frequency device that emits the radio frequency signal into an installation location, detecting, via the radio frequency detector, a radio frequency noise floor associated with the installation location based on the radio frequency signal, comparing, by the processing component, the radio frequency noise floor to a noise floor threshold associated with an operating frequency of a device, generating, by the processing component, an indication that indicates an outcome of the comparing, and outputting, to the display, the indicator, wherein the indicator indicates, based on the outcome, if the device should be installed at the installation location. In some embodiments, the radio frequency signals are emitted in one frequency selected from the group of frequency ranges consisting of a first frequency range of 315 MHz, a second frequency range of 400-433 MHz, a third frequency range of 863-870 MHz (EU ISM Band), and a fourth frequency range of 902-928 MHz (US ISM Band).

In some embodiments, detecting the request can include detecting selection of the switch, and selection of the switch can cause a power source to supply power to the processing component. In some embodiments, generating the indication can include generating a pass indication if a first determination is made that the radio frequency noise floor does not exceed the noise floor threshold; and generating a fail indication if a second determination is made that the radio frequency noise floor does exceed the noise floor threshold. In some embodiments, generating the indication can include generating a pass indication if a first determination is made that the radio frequency noise floor does not exceed a first noise floor threshold; generating a fail indication if a second determination is made that the radio frequency noise floor does exceed the first noise floor threshold; and generating a conditional pass indication if a third determination is made that the radio frequency noise floor does not exceed the first noise floor threshold but does exceed a second noise floor threshold. In some embodiments, the device also can include an adjustable circuit. The processing component can be configured to cause the device to perform operations further including determining the noise floor threshold based on a position of the adjustable circuit.

According to another aspect of the concepts and technologies disclosed herein, a device is disclosed. The device can include a display; an antenna; a radio frequency detector; and a processing component. The processing component can be configured to cause the device to perform the operations including detecting a request to perform an installation location noise floor evaluation test, receiving, via the antenna, a radio frequency signal emitted by a radio frequency device that emits the radio frequency signal into an installation location, detecting, via the radio frequency detector, a radio frequency noise floor associated with the installation location based on the radio frequency signal, comparing, by the processing component, the radio frequency noise floor to a noise floor threshold associated with an operating frequency of a device, generating, by the processing component, an indication that indicates an outcome of the comparing, and outputting, to the display, the indicator. The indicator can indicate, based on the outcome, if the device should be installed at the installation location.

In some embodiments, detecting the request includes detecting selection of a button, and selection of the button can cause a power source to supply power to the processing component. In some embodiments, generating the indication can include generating a pass indication if a first determination is made that the radio frequency noise floor does not exceed the noise floor threshold; and generating a fail indication if a second determination is made that the radio frequency noise floor does exceed the noise floor threshold. In some embodiments, the display includes a single light emitting diode that, if activated, indicates that the radio frequency noise floor does not exceed the noise floor threshold. In some embodiments, the display includes two light emitting diodes. A first of the two light emitting diodes can indicate, if activated, that the radio frequency noise floor does not exceed the noise floor threshold.

In some embodiments, generating the indication can include generating a pass indication if a first determination is made that the radio frequency noise floor does not exceed a first noise floor threshold; generating a fail indication if a second determination is made that the radio frequency noise floor does exceed the first noise floor threshold; and generating a conditional pass indication if a third determination is made that the radio frequency noise floor does not exceed the first noise floor threshold but does exceed a second noise floor threshold. In some embodiments, the display includes three light emitting diodes. A first of the three light emitting diodes can correspond, if activated, to the pass indication, a second of the three light emitting diodes can correspond, if activated, to the fail indication, and a third of the three light emitting diodes can correspond, if activated, to the conditional pass indication.

In some embodiments, the device also can include an adjustable circuit. It can be appreciated that according to various embodiments of the concepts and technologies disclosed herein, a dynamic range can be controlled by a potentiometer, adjusting filters, changing digital filter coefficients, an automatic gain control ("AGC"), or other functionality. The processing component can be configured to cause the device to perform the operations further including determining the noise floor threshold based on a position of the adjustable circuit. In some embodiments, the radio frequency signals are emitted in one frequency selected from the group of frequency ranges consisting of a first frequency range including 315 MHz, a second frequency range of 400-433 MHz, a third frequency range of 863-870 MHz (EU ISM Band), and a fourth frequency range of 902-928 MHz (US ISM Band). In some embodiments, the device includes a burglar alarm component.

According to yet another aspect, a device is disclosed. The device can include a processor and a memory. The memory can store computer-executable instructions that, when executed by the processor, cause the processor to perform operations. The operations can include detecting a request to perform an installation location noise floor evaluation test, receiving, via the antenna, a radio frequency signal emitted by a radio frequency device that emits the radio frequency signal into an installation location, detecting, via the radio frequency detector, a radio frequency noise floor associated with the installation location based on the radio frequency signal, comparing the radio frequency noise floor to a noise floor threshold associated with an operating frequency of a device, generating an indication that indicates an outcome of the comparing, and outputting, to the display, the indicator. The indicator can indicate, based on the outcome, if the device should be installed at the installation location. The radio frequency signals can be emitted in one frequency selected from the group of frequency ranges consisting of a first frequency range including 315 MHz, a second frequency range of 400-433 MHz, a third frequency range of 863-870 MHz (EU ISM Band), and a fourth frequency range of 902-928 MHz (US ISM Band).

In some embodiments, generating the indication can include generating a pass indication if a first determination is made that the radio frequency noise floor does not exceed the noise floor threshold; and generating a fail indication if a second determination is made that the radio frequency noise floor does exceed the noise floor threshold. In some embodiments, generating the indication can include generating a pass indication if a first determination is made that the radio frequency noise floor does not exceed a first noise floor threshold; generating a fail indication if a second determination is made that the radio frequency noise floor does exceed the first noise floor threshold; and generating a conditional pass indication if a third determination is made that the radio frequency noise floor does not exceed the first noise floor threshold but does exceed a second noise floor threshold.

Other systems, methods, devices, and/or computer program products according to embodiments will be or become apparent to one with skill in the art upon review of the following drawings and detailed description. It is intended that all such additional systems, methods, and/or computer program products be included within this description, be within the scope of this disclosure.

DETAILED DESCRIPTION

Figure 1:
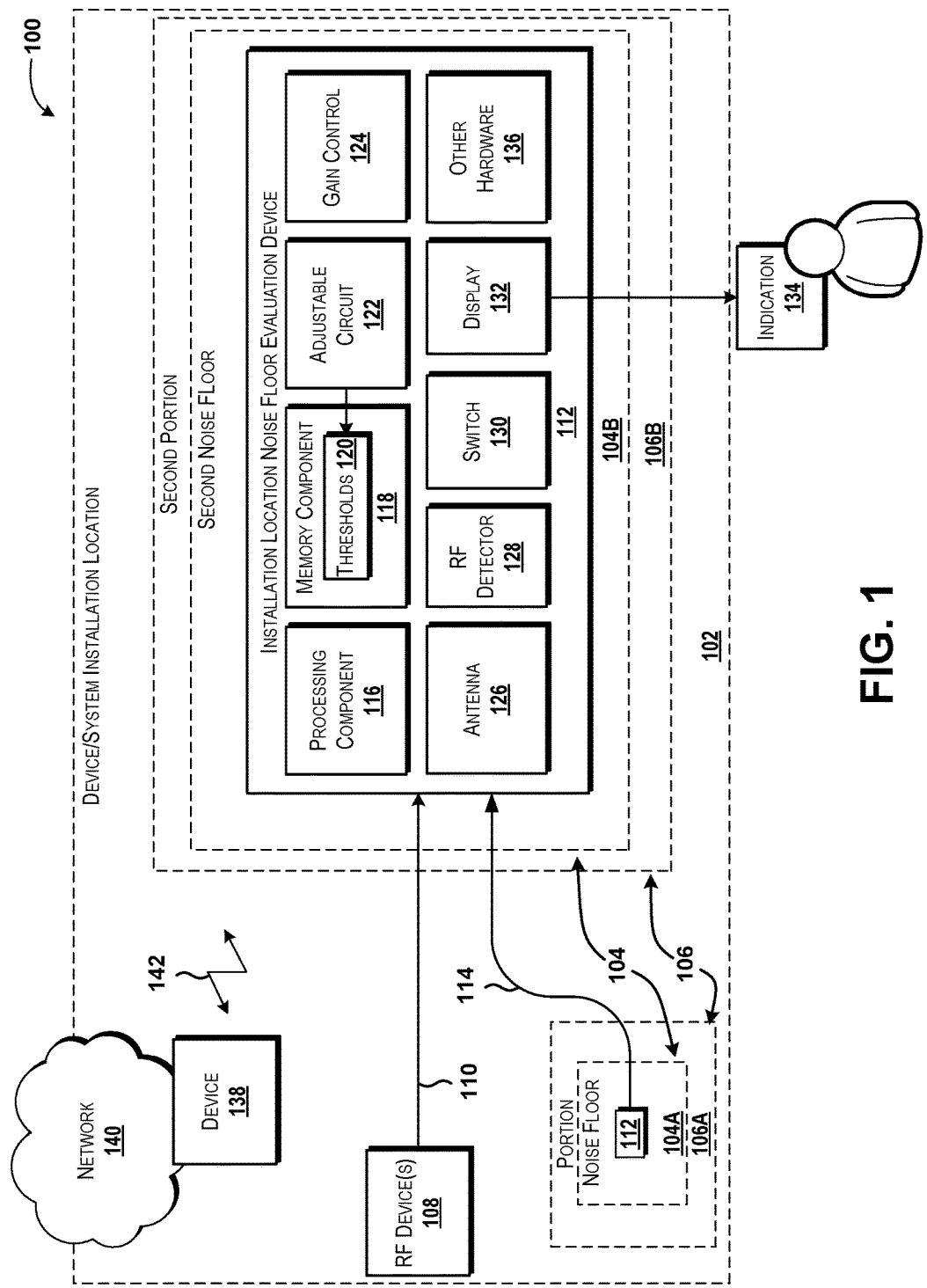
FIG. 1 is a system diagram illustrating an illustrative operating environment for various embodiments of the concepts and technologies described herein.

The following detailed description is directed to an installation location noise floor evaluation device. According to various embodiments of the concepts and technologies disclosed herein, a user or other entity can determine that a device, system, or system component (hereinafter referred to as a "device") is being installed or otherwise located at the installation location. The device can include, according to various embodiments, a home burglar alarm system or other connected home system (e.g., a home gateway), a controller or other component thereof, or the like. The user or other entity can determine, or may be told, an operating frequency associated with one or more signals emitted by and/or received by the device. The operating frequency may have an associated noise floor threshold, or the noise floor threshold may be specified by a manual, an instruction, or the like. The operating frequency and/or noise floor threshold can be used to set (or change) an associated threshold for testing a noise floor at the installation location. In some embodiments, the installation location noise floor evaluation device can include an adjustable threshold (e.g., the user or other entity can manipulate an adjustable circuit of the installation location noise floor evaluation device) or the noise floor can have a fixed threshold and/or may be designed for only one operating frequency and/or associated noise floor threshold.

The user or other entity may press or otherwise select the switch (e.g., a button) to activate the installation location noise floor evaluation device. The installation location noise floor evaluation device can receive one or more RF signals from one or more RF devices located at or near the installation location (or at least emitting signals that can be detected at the installation location) via an antenna and/or an RF detector (e.g., a signal processor). The received and/or detected signals can be compared to a specified threshold and compliance or non-compliance with the specified threshold can be determined by the installation location noise floor evaluation device. The installation location noise floor evaluation device can output an indicator that indicates the compliance or non-compliance via a display.

If the user or other entity determines that installation of the device is proper or improper based on the indication (and optionally additionally upon other considerations), the user or other entity can relocate to another portion of the installation location if desired and continue testing until either a portion of the installation location is identified that complies with the threshold for noise floor and/or until it is determined that no portion of the installation location is identified that complies with the threshold. The device can then either be installed or not installed, based on the indication.

While the subject matter described herein is presented in the general context of program modules that execute in conjunction with the execution of an operating system and application programs on a computer system, those skilled in the art will recognize that other implementations may be performed in combination with other types of program modules. Generally, program modules include routines, programs, components, data structures, and other types of structures that perform particular tasks or implement particular abstract data types. Moreover, those skilled in the art will appreciate that the subject matter described herein may be practiced with other computer system configurations, including hand-held devices, multiprocessor systems, microprocessor-based or programmable consumer electronics, minicomputers, mainframe computers, and the like.

Referring now to FIG. 1, aspects of an illustrative operating environment 100 for various embodiments of the concepts and technologies disclosed herein for installation location noise floor evaluation device will be described, according to an illustrative embodiment. It should be understood that the operating environment 100 and the various components thereof have been greatly simplified for purposes of discussion. Accordingly, additional or alternative components of the operating environment 100 can be made available without departing from the embodiments described herein.

The operating environment 100 shown in FIG. 1 includes a device or system installation location (hereinafter referred to as an "installation location") 102. The installation location 102 can include, but is not limited to, an office building, an outdoor area, a warehouse, a factory, a room, a store, and/or other commercial structure or area; a residential structure such as a single-family home, an apartment, a townhouse, a multi-family home, a condominium, a recreational vehicle, a mobile home, and/or other residential structure; and/or other indoor or outdoor location. It should be understood that the concepts and technologies disclosed herein can be applied to other types of locations, structures, buildings, and/or locations. As such, the above examples must be understood as being illustrative and should not be construed as being limiting in any way.

It can be appreciated that given the proliferation of devices that generate radio frequency ("RF") signals, that the installation location 102 may have a first noise floor 104A associated with a first portion 106A of the installation location 102. As used herein, a "noise floor," such as the first noise floor 104A, can refer to a measure of total RF signals created from the sum of all RF signal emitting devices ("RF devices") 108 whose RF signals 110 exist at the first portion 106A of the installation location 102. The RF devices 108 can include almost any type of device, system, or component thereof that emits (or can omit) RF signals 110. The RF devices 108 therefore can emit RF noise into an environment associated with the installation location 102 and/or one or more portions 106 thereof, and that this RF noise can be emitted by the RF devices 108 unintentionally, intentionally, and/or incidental to transmission of other RF signals 110 (e.g., in accordance with various operations associated with the RF devices 108). Regardless of the cause of the RF noise, it can be appreciated that in some instances, RF noise (e.g., RF signals 110) may be detectable and/or perceived at one portion 106 of the installation location 102 and not detectable or perceived at another portion 106 of the installation location 102. In some other instances, RF noise (e.g., RF signals 110) may be detectable and/or perceived at multiple portions 106 of the installation location 102 and/or throughout the installation location 102.

As will be explained in more detail herein, an installation location noise floor evaluation device 112 can be used to detect and/or evaluate a noise floor at any location such as, for example, the first noise floor 104A at the first portion 106A of the installation location 102. Similarly, the installation location noise floor evaluation device 112 can be moved to a second portion 106B of the installation location 102 along a path 114. When located at the second portion 106B of the installation location 102, the installation location noise floor evaluation device 112 can measure a second noise floor 104B at the second portion 106B of the installation location 102. Thus, the installation location noise floor evaluation device 112 can be used to measure and evaluate noise floor at any number of locations, as will be illustrated and described herein.

The installation location noise floor evaluation device 112 can include various components to measure, evaluate, and communicate information (e.g., via outputting one or more indicators or indications) regarding one or more noise floor measurements as illustrated and described herein. As shown in FIG. 1, some embodiments of the installation location noise floor evaluation device 112 can include a processing component 116. According to various embodiments of the concepts and technologies disclosed herein, the processing component 116 can include a central processor or central processing unit ("CPU") that can perform arithmetic and logical operations. In some other embodiments, the processing component 116 can include a specific purpose programmable logic controller ("PLC"), a programmable gate array, or other type of processor that can be suitable for performing the operations and/or processes illustrated and described herein.

Thus, as used herein and in the claims, the word "processor," the phrase "processing component," and/or the phrase "processing unit" when used with regard to any architecture or system can include multiple processors as defined herein and/or processing units as defined herein, one or more of which can be distributed across and/or operated in parallel in a single machine or in multiple machines. Furthermore, processors and/or processing units can be used to support virtual processing environments. Additionally, some embodiments of the processing component 116, as well as processors and processing units, can include state machines, application-specific integrated circuits ("ASICs"), combinations thereof, or the like. It should be understood that these examples are illustrative, and therefore should not be construed as being limiting in any way.

Some embodiments of the installation location noise floor evaluation device 112 can include a memory component 118. The memory component 118 can be provided by any computer-readable medium. By way of example, and not limitation, computer-readable media may include any available computer storage media or communication media that can be accessed by the installation location noise floor evaluation device 112 and/or any component thereof. Communication media includes computer-readable instructions, data structures, program modules, or other data in a modulated data signal such as a carrier wave or other transport mechanism and includes any delivery media. The term "modulated data signal" means a signal that has one or more of its characteristics changed or set in a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

Computer storage media includes volatile and non-volatile, removable and non-removable media implemented in any method or technology for storage of information such as computer-readable instructions, data structures, program modules, or other data. Computer storage media includes, but is not limited to, RAM, ROM, Erasable Programmable ROM ("EPROM"), Electrically Erasable Programmable ROM ("EEPROM"), flash memory or other solid state memory technology, CD-ROM, digital versatile disks ("DVD"), or other optical storage, magnetic cassettes, magnetic tape, magnetic disk storage or other magnetic storage devices, or any other medium which can be used to store the desired information and which can be accessed by the installation location noise floor evaluation device 112 and/or a component thereof. In the claims, the phrase "computer storage medium" and variations thereof does not include waves or signals per se and/or communication media as defined herein.

The memory component 118 can be included in some embodiments to store computer-executable instructions that, when executed by the processing component 116, cause the installation location noise floor evaluation device 112 to perform operations as illustrated and described herein, though this is not necessarily the case. In some embodiments, the memory component 118 also can store one or more noise floor thresholds ("thresholds") 120. The thresholds 120 can specify particular thresholds for noise floor as illustrated and described herein, and can be established and/or specified by one or more hardware configurations associated with the installation location noise floor evaluation device 112, by adjustable/selectable hardware associated with the installation location noise floor evaluation device 112, by software settings or options that can be accessed by some embodiments of the installation location noise floor evaluation device 112, and/or otherwise can be set by various entities including, but not limited to, an installation technician, a hardware designer of the installation location noise floor evaluation device 112, a user of the installation location noise floor evaluation device 112, and/or other entities.

In some embodiments, e.g., in some embodiments where the processing component 116 of the installation location noise floor evaluation device 112 can be provided by ASICs, state machines, analog circuitry, or the like, the memory component 118 may be omitted entirely, the memory component 118 may store only the thresholds 120, the memory component 118 may store other information and/or data, or the like. It can be appreciated that in some embodiments, the thresholds 120 can be set by an electrical or physical component such as, for example, an adjustable circuit 122 or other component, as noted above. As noted above, the thresholds 120 can be set using a potentiometer, by applying filters, by changing digital filter coefficients, by a gain control and/or an automatic gain control, and/or by using other functionality. It should be understood that these examples are illustrative, and therefore should not be construed as being limiting in any way.

In the illustrated embodiment, which includes the adjustable circuit 122, the adjustable circuit 122 can be used to set, change, or adjust a noise floor threshold (e.g., a threshold 120) for the installation location noise floor evaluation device 112. In some embodiments, the threshold 120 can be set or varied depending upon what type of system or device is being installed (and its associated operating frequencies and/or noise floor tolerance(s)). Thus, as will be illustrated and described in more detail herein with reference to FIGS. 2-3, a user or other entity may manipulate the adjustable circuit 122 to set a threshold 120, activate the installation location noise floor evaluation device 112, and thereby measure (and receive feedback relating to) the observed noise floor relative to the threshold 120. It can be appreciated that in some embodiments, the installation location noise floor evaluation device 112 may be configured to determine compliance with only one threshold 120, and as such, the adjustable circuit 122 may be omitted in some embodiments and/or replaced with a device that sets a fixed threshold 120. These and other aspects of the concepts and technologies disclosed herein will be illustrated and described in more detail below.

In some embodiments, the installation location noise floor evaluation device 112 also can include a gain control module ("gain control") 124, which can function as an automatic gain control ("AGC"), in some embodiments. The gain control 124 can be included to raise/amplify (increase gain of) the signal strength of the RF signals 110 received and/or detected by the installation location noise floor evaluation device 112. By increasing the strength of the RF signals 110, the installation location noise floor evaluation device 112 can be configured to effectively distinguish incoming signals that may be desirable (e.g., signals from sensors, controllers, or the like) from RF noise created by other device(s) located in and around the installation location 102, such as the RF devices 108. If the installation location noise floor evaluation device 112 determines that a signal level of a desired signal (not illustrated in FIG. 1) is below an established signal reliability threshold, the installation location noise floor evaluation device 112 can disable the gain control 124, though this is not necessarily the case. Thus, it can be appreciated that various embodiments of the concepts and technologies disclosed herein can omit the gain control 124. As such, the illustrated example is illustrative, and therefore should not be construed as being limiting in any way.

The installation location noise floor evaluation device 112 also can include an antenna 126. The antenna 126 can be configured to receive signals such as, for example, the RF signals 110 emitted from the RF device(s) 108. The antenna 126 can be configured to receive the RF signals 110 for purposes of measuring a noise floor 104 at or near the installation location noise floor evaluation device 112 as illustrated and described herein. It can be appreciated that the antenna 126 may be configured to receive any signals, but that an RF detector 128 can be tuned to recognize only RF signals 110 emitted in a particular frequency that is of interest. For example, if a burglar alarm is being installed by an entity and is to operate in a 400-433 MHz range, the installation location noise floor evaluation device 112 may be configured (e.g., by way of the antenna 126 and/or RF detector 128) to detect or consider only RF signals 110 emitted in the 400-433 MHz range as only these RF signals 110 may interfere with the system or device being installed. It should be understood that this example is illustrative, and therefore should not be construed as being limiting in any way.

The installation location noise floor evaluation device 112 can also include one or more switch 130. The switch 130 can be used, in some embodiments, to activate the installation location noise floor evaluation device 112. In one contemplated embodiment, a user or other entity may manipulate the adjustable circuit 122 to set a threshold 120 for the installation location noise floor evaluation device 112, and then select, push, pull, or otherwise manipulate the switch 130 to activate the installation location noise floor evaluation device 112. On activation, the installation location noise floor evaluation device 112 can measure RF signals 110 received and/or detected via the antenna 126 and/or RF detector 128, and compare (e.g., using the processing component 116) the RF signals 110 against the threshold 120 specified. It therefore can be appreciated that manipulation of the switch 130 can result in powering of the installation location noise floor evaluation device 112 and/or its components to cause the installation location noise floor evaluation device 112 to perform the operations illustrated and described herein. It should be understood that this example is illustrative, and therefore should not be construed as being limiting in any way.

The installation location noise floor evaluation device 112 also can include a display 132. The display can be provided by various types of visual displays such as, for example, a digital display, a light emitting diode ("LED") display, one or more LEDs (e.g., a red LED, yellow LED, green LED, combinations thereof, or the like), other types of displays, or the like. In one contemplated embodiment, the display 132 includes a single LED that, if illuminated during operation, indicates that the measured RF signals 110 comply with the threshold 120. In another contemplated embodiment, the display 132 includes two LEDs, one of which indicates operation of the installation location noise floor evaluation device 112 and a second of which indicates compliance (or failure to comply) with a selected or specified threshold 120. In yet another contemplated embodiment, the display 132 includes three LEDs, a first of which (e.g., a red LED) indicates that the threshold 120 is violated (the noise floor 104 exceeds the defined threshold); a second of which (e.g., a yellow LED) indicates that the threshold 120 is nearly violated (e.g., that a noise floor 104 is within a defined borderline threshold); and a third of which (e.g., a green LED) indicates that the threshold 120 is not violated or nearly violated. Because other types of displays are possible and are contemplated, it should be understood that these examples are illustrative, and therefore should not be construed as being limiting in any way.

Regardless of the configuration of the display 132, the display 132 can output a radio frequency noise floor threshold evaluation indication ("RFNFE indication") 134. The RFNFE indication 134 can be used to quickly and easily evaluate whether a system or device will operate properly in the portion 106 of the installation location 102 being evaluated. Thus, an entity such as an installation technician may move around the installation location 102 to identify a portion 106 of the installation location 102 that has a lowest amount of RF interference (i.e., a lowest noise floor 104). It should be understood that this example is illustrative, and therefore should not be construed as being limiting in any way.

The installation location noise floor evaluation device 112 also can include other hardware 136. The other hardware 136 can include any other components of the installation location noise floor evaluation device 112 including, but not limited to, a housing, power sources (internal and/or external power sources), printed instructions or labels, other hardware, and the like. According to various embodiments of the concepts and technologies disclosed herein, the other hardware 136 can include at least a housing, a power source (an internal battery or an external power source), and instructions that can be formed as part of the housing and/or attached to the housing as a label. It should be understood that this example is illustrative, and therefore should not be construed as being limiting in any way.

In practice, a user or other entity can determine that a device, system, or system component (hereinafter referred to as a "device") 138 is being installed or otherwise located at the installation location 102. The device 138 can include, according to various embodiments, a home burglar alarm system or other connected home system (e.g., a home gateway), a controller or other component thereof, or the like. In one contemplated embodiment, the device 138 includes a customer premises equipment ("CPE") for a member of the AT&T DIGITAL LIFE family of products from AT&T Corporation in Bedminster, N.J. It should be understood that this example is illustrative, and therefore should not be construed as being limiting in any way.

In some embodiments, the device 138 can be configured to communicate with and/or operate as a component on a communications network ("network") 140, though this is not necessarily the case. Additionally, various embodiments of the installation location noise floor evaluation device 112 can include a networking interface for communicating via the network 140. For example, the installation location noise floor evaluation device 112 can be configured to communicate a result from an installation location noise floor evaluation test to one or more other entities (e.g., a network operator device, or the like). It should be understood that this example is illustrative, and therefore should not be construed as being limiting in any way. Various aspects of the network 140 are illustrated and described herein with reference to FIG. 4.

The user or other entity can determine, or may be told, an operating frequency associated with one or more signals 142 emitted by and/or received by the device 138. The operating frequency may have an associated noise floor threshold, or the noise floor threshold may be specified by a manual, instruction, or the like. Based on the operating frequency and/or noise floor threshold, the user or other entity can manipulate the adjustable circuit 122 of the installation location noise floor evaluation device 112. As noted above, the installation location noise floor evaluation device 112 may be provided with a fixed threshold 120 and/or may be designed for only one operating frequency and/or associated noise floor threshold and as such, the adjustable circuit 122 and/or the manipulation thereof may be omitted in various embodiments of the concepts and technologies disclosed herein.

The user or other entity may press or otherwise select the switch 130 (e.g., a button) to activate the installation location noise floor evaluation device 112. The installation location noise floor evaluation device 112 can receive one or more RF signals 110 from one or more RF devices 108 via the antenna 126 and/or RF detector 128. The received and/or detected signals can be compared to a specified threshold 120 and compliance (or non-compliance) with the specified threshold 120 can be determined by the installation location noise floor evaluation device 112. The installation location noise floor evaluation device 112 can output an indication 134 via the display 132. The user or other entity can determine that installation of the device 138 is proper or improper based on the indication 134 (and optionally additionally upon other considerations). If the portion 106 of the installation location 102 at which the installation location noise floor evaluation device 112 is located does not pass the evaluation, the user or other entity can relocate to another portion 106 of the installation location 102 if desired and continue testing until either a portion 106 of the installation location 102 is identified that complies with the threshold (for noise floor 104) and/or no portion 106 of the installation location 102 is identified that complies with the threshold 120. The device 138 can then either be installed or not installed, based on the indication 134. It should be understood that this example is illustrative, and therefore should not be construed as being limiting in any way.

FIG. 1 illustrates one installation location 102, two noise floors 104, two portions 106 of the installation location 102, one instance of RF devices 108, and one installation location noise floor evaluation device 112. It should be understood, however, that various implementations of the operating environment 100 can more than one installation location 102; one, two, or more than two noise floors 104; zero, one, or more than one portion 106 of the installation location 102; zero, one, or more than one RF device 108; and/or zero, one, or more than one installation location noise floor evaluation device 112. As such, the illustrated embodiment should be understood as being illustrative, and should not be construed as being limiting in any way.

Figure 2:
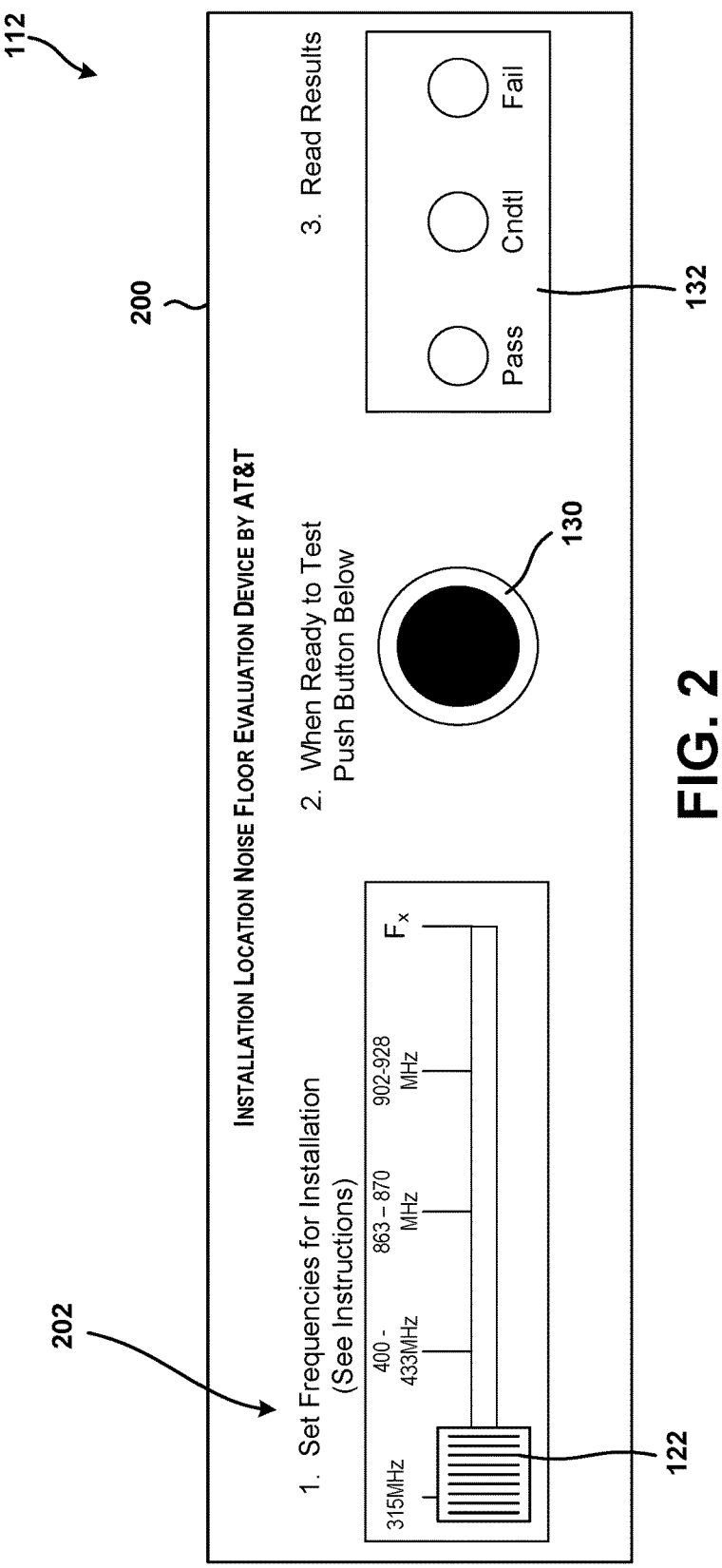
FIG. 2 is a line drawing showing aspects of the installation location noise floor evaluation device, according to one illustrative embodiment of the concepts and technologies disclosed herein.

Turning now to FIG. 2, additional aspects of the installation location noise floor evaluation device 112 are illustrated, according to one embodiment of the concepts and technologies disclosed herein. It should be understood that the components of the installation location noise floor evaluation device 112 illustrated and described above with reference to FIG. 1 can be included in, but are not be explicitly shown in, the device illustrated in FIG. 2. As shown in FIG. 2, the installation location noise floor evaluation device 112 can include a housing 200. The housing 200 can be formed from one or more polymers such as, for example, one or more plastics, thermoplastics, acrylics, NYLON, epoxies, or the like; one or more metals such as, for example, aluminum, zinc, steel, brass, or other metals or combinations thereof; other composites such as, for example, paper composites, cardboards, or the like. The housing 200 can be configured to support the components of the installation location noise floor evaluation device 112 within a safe yet inexpensive package. It should be understood that this example is illustrative, and therefore should not be construed as being limiting in any way.

The installation location noise floor evaluation device 112 can also include printed instructions 202. The printed instructions 202 can be omitted in some embodiments. The printed instructions 202 illustrated in FIG. 2 are provided such that the printed instructions 202 walk the user or other entity through an evaluation test using the installation location noise floor evaluation device 112. Thus, a first instruction is printed at or near the adjustable circuit 122 and instructs a user or other entity that a first step or operation in the test is to set a noise floor threshold such as the threshold 120. In the illustrated embodiment, the noise floor threshold is set using the operating frequency (or frequency range) of the device 138 being installed. It should be understood that this example is illustrative, and therefore should not be construed as being limiting in any way. In some embodiments, the adjustable circuit 122 can instead be labeled with a noise floor threshold (which may be known by or communicated to the user or other entity). As noted above, the installation location noise floor evaluation device 112 can be configured to measure only one operating frequency and/or noise floor threshold, and as such, the adjustable circuit 122 and/or the associated printed instructions 202 can be omitted. The printed instructions 202 can be printed on the housing 200, formed as a part of the housing 200, printed on a label that can be attached to the housing 200, or the like. It should be understood that these examples are illustrative, and therefore should not be construed as being limiting in any way.

The installation location noise floor evaluation device 112 also can include a button or other type switch 130, as well as printed instructions 202 that can indicate that the switch 130 should be activated after setting the noise floor threshold and/or operating frequency. Thus, it can be appreciated that selection, pressing, or other manipulation of the switch 130 can power the installation location noise floor evaluation device 112 and cause the installation location noise floor evaluation device 112 to perform an evaluation of the noise floor 104 at or near the installation location noise floor evaluation device 112. It should be understood that this example is illustrative, and therefore should not be construed as being limiting in any way.

The installation location noise floor evaluation device 112 also can include the display 132 as illustrated and described in FIG. 1. The display 132 can be used to communicate results of the evaluation performed by the installation location noise floor evaluation device 112. Thus, the display 132 can display the indication 134, which can indicate whether the device 138 can or cannot be installed at the installation location 102 and/or a portion 106 thereof. It should be understood that these examples are illustrative, and therefore should not be construed as being limiting in any way.

Figure 3:
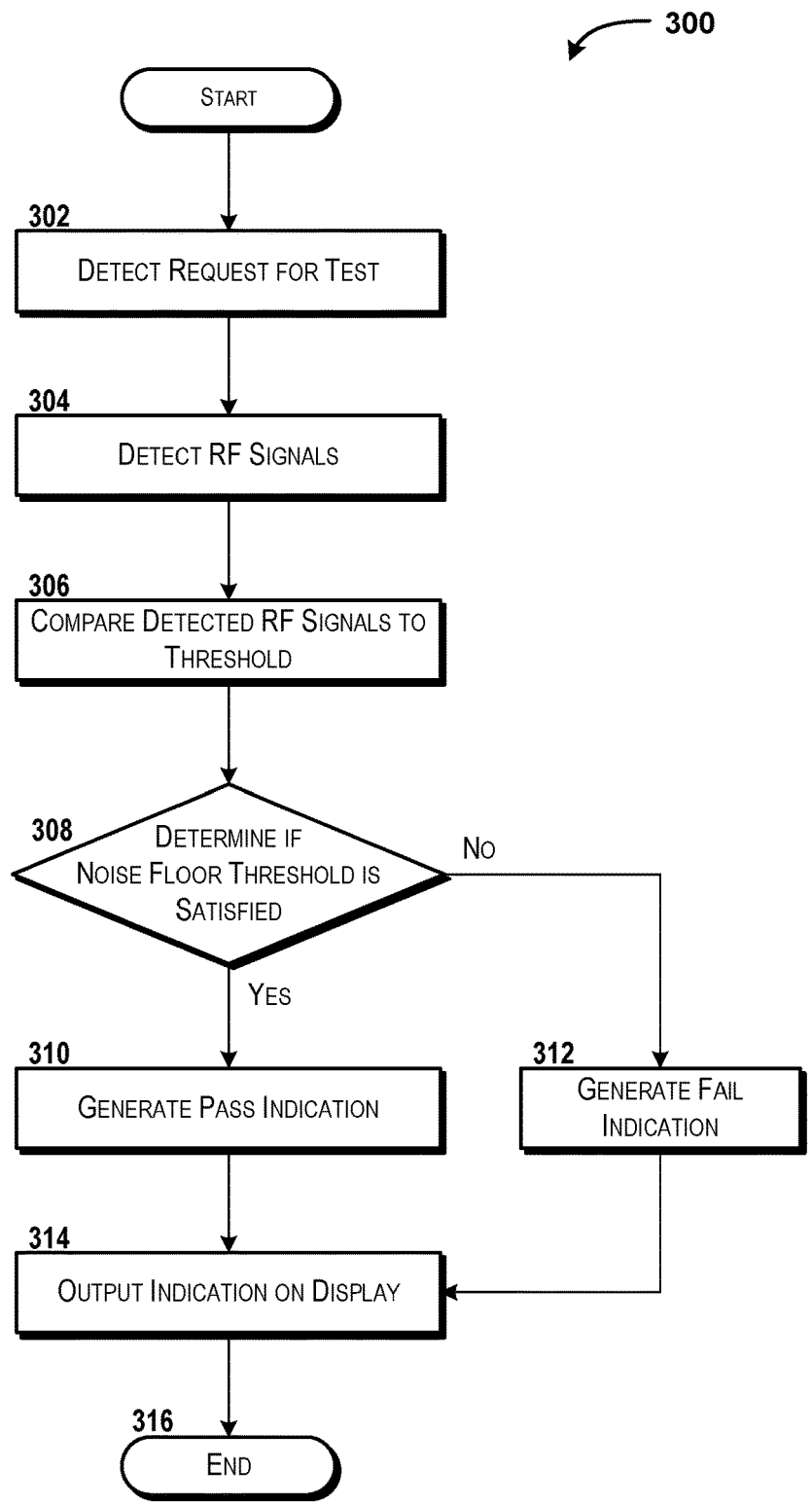
FIG. 3 is a flow diagram showing aspects of a process for evaluating a noise floor of an installation location, according to an illustrative embodiment of the concepts and technologies described herein.

Turning now to FIG. 3, aspects of a process 300 for evaluating a noise floor of an installation location will be described in detail, according to an illustrative embodiment. It should be understood that the operations of the process 300 disclosed herein are not necessarily presented in any particular order and that performance of some or all of the operations in an alternative order(s) is possible and is contemplated. The operations have been presented in the demonstrated order for ease of description and illustration. Operations may be added, omitted, and/or performed simultaneously, without departing from the scope of the concepts and technologies disclosed herein.

It also should be understood that the process 300 disclosed herein can be ended at any time and need not be performed in its entirety. Some or all operations of the process 300, and/or substantially equivalent operations, can be performed by execution of computer-readable instructions included on a computer storage media, as defined herein, by a computing device such as the computing device illustrated and described below with reference to FIG. 5 instead of, or in addition to, the installation location noise floor evaluation device 112. The term "computer-readable instructions," and variants thereof, as used herein, is used expansively to include routines, applications, application modules, program modules, programs, components, data structures, algorithms, and the like. Computer-readable instructions can be implemented on various system configurations including single-processor or multiprocessor systems, minicomputers, mainframe computers, personal computers, hand-held computing devices, microprocessor-based, programmable consumer electronics, combinations thereof, and the like.

Thus, it should be appreciated that the logical operations described herein can therefore be implemented (1) as a sequence of computer implemented acts or program modules running on a computing system instead of, or in addition to, (2) interconnected machine logic circuits or circuit modules within the installation location noise floor evaluation device 112. Accordingly, the logical operations described herein are referred to variously as states, operations, structural devices, acts, or modules. These states, operations, structural devices, acts, and modules may be implemented in software, in firmware, in special purpose digital logic, and any combination thereof, in addition to (or instead of) the installation location noise floor evaluation device 112. As used herein, the phrase "cause a processor to perform operations" and variants thereof is used to refer to causing a processor of a computing system or device, such as the installation location noise floor evaluation device 112 to perform one or more operations and/or causing the processor to direct other components of the computing system or device to perform one or more of the operations.

For purposes of illustrating and describing the concepts of the present disclosure, the process 300 is described as being performed by the installation location noise floor evaluation device 112. It can be appreciated that a computer system can perform the operations illustrated and described herein via execution of one or more software modules such as, for example, an installation location noise floor evaluation application. It should be understood that additional and/or alternative devices and/or network nodes can provide the functionality described herein via execution of one or more modules, applications, and/or other software including, but not limited to, the installation location noise floor evaluation application and/or a similar application or module. Thus, the illustrated embodiments are illustrative, and should not be viewed as being limiting in any way.

The process 300 begins at operation 302. At operation 302, the installation location noise floor evaluation device 112 can detect a request for a test such as, for example, an installation location noise floor evaluation test. The installation location noise floor evaluation device 112 can detect the request for a test in a number of manners. In some embodiments, the installation location noise floor evaluation device 112 can detect the request by detecting selection, pressing, and/or other manipulation of a button or switch (e.g., the switch 130). As illustrated and described with reference to FIG. 2, an interaction with the switch 130 can be understood as a request for the test. In some other embodiments, the installation location noise floor evaluation device 112 can detect the request by receiving an explicit request for a test. Regardless of how the request to perform the test is detected, the installation location noise floor evaluation device 112 can detect the request in operation 302 and commence performance of the test as illustrated and described herein in response to the request. It should be understood that the installation location noise floor evaluation device 112 may not need to explicitly detect a request for a test, per se, and that the operations of the process 300 illustrated and described herein can be performed by the installation location noise floor evaluation device 112 in response to some trigger in operation 302 such as, for example, pressing of, selection of, or other manipulation of the switch 130, or the like. It should therefore be understood that the illustrated example is illustrative and should not be construed as being limiting in any way.

From operation 302, the process 300 can proceed to operation 304. At operation 304, the installation location noise floor evaluation device 112 can detect one or more RF signals such as, for example, the RF signals 110 illustrated and described above with reference to FIG. 1. It can be appreciated that the installation location noise floor evaluation device 112 can perform operation 304 in response to detecting the request for the test (or detecting another trigger as illustrated and described herein).

In operation 304, the installation location noise floor evaluation device 112 can activate the RF detector 128 to detect, in information received via the antenna 126, one or more RF signals 110. As shown in FIG. 1, the RF signals 110 detected in operation 304 can correspond to RF signals 110 associated with a noise floor 104 at a portion 106 of the installation location 102. Thus, it can be appreciated that as the installation location noise floor evaluation device 112 is moved through, out of, within, or around the installation location 102, that the RF signals 110 associated with a noise floor 104 and/or portion 106 of the installation location 102 can change. At any rate, the installation location noise floor evaluation device 112 can detect, in operation 304, the RF signals 110 at a particular location. It can be appreciated that the installation location noise floor evaluation device 112 can filter the RF signals 110 for RF signals 110 emitted at a particular frequency (e.g., the operating frequency of the device 138 being installed, or the like), if desired. Thus, although not shown in FIG. 2, it can be appreciated that the installation location noise floor evaluation device 112 can include filters, tuners, or other functionality for isolating and/or ignoring particular signals, frequencies, or the like. It should be understood that these examples are illustrative, and therefore should not be construed as being limiting in any way.

From operation 304, the process 300 can proceed to operation 306. At operation 306, the installation location noise floor evaluation device 112 can compare the RF signals 110 detected in operation 304 (after applying the various filters, etc.) to a threshold 120. As illustrated and described herein, the threshold 120 can be selected and/or may be set for the installation location noise floor evaluation device 112. Thus, the installation location noise floor evaluation device 112 can compare the RF signals 110 detected in operation 304 to the threshold 120 to determine if the noise floor 104 exceeds a noise floor threshold or whether the RF signals 110 detected in operation 304 do not exceed the noise floor threshold. In some embodiments, various threshold levels may be established for noise floor to take into account expected or known fluctuations. As such, the installation location noise floor evaluation device 112 can be configured to compare the RF signals 110 detected in operation 304 to multiple thresholds 120 in operation 306 and determine compliance, non-compliance, borderline compliance, and/or other types of compliance and/or non-compliance with one or more of the thresholds in operation 306.

From operation 306, the process 300 can proceed to operation 308. At operation 308, the installation location noise floor evaluation device 112 can determine whether the noise floor threshold(s) to which the RF signals 110 have been compared are satisfied (i.e., complied with). As can be appreciated with reference to the description of operation 306, multiple thresholds 120 can be evaluated in accordance with the concepts and technologies disclosed herein, and as such, the installation location noise floor evaluation device 112 can determine one or more levels of compliance and/or non-compliance with the thresholds 120. Thus, while FIG. 3 illustrates a binary outcome for operation 308, it should be understood that multiple outcomes are possible for operation 308 as will be understood with reference to the description herein. Thus, the example of a binary outcome for operation 308 is illustrative and should not be construed as being limiting in any way.

If the installation location noise floor evaluation device 112 determines, in operation 308, that the noise floor threshold (being compared to in operation 306) is satisfied, the process 300 can proceed to operation 310. At operation 310, the installation location noise floor evaluation device 112 can generate a pass indication as the indication 134. The pass indication can indicate to a user or other entity that the noise floor threshold is satisfied at the installation location 102 (and/or a portion 106 thereof).

If the installation location noise floor evaluation device 112 determines, in operation 308, that the noise floor threshold (being compared to in operation 306) is not satisfied, the process 300 can proceed to operation 312. At operation 312, the installation location noise floor evaluation device 112 can generate a fail indication as the indication 134. The fail indication can indicate to a user or other entity that the noise floor threshold is not satisfied at the installation location 102 (and/or a portion 106 thereof).

It can be appreciated that if multiple thresholds are being evaluated in operation 308 (e.g., if a borderline threshold is defined), that the outcome in operation 308 can include a third option, namely, a borderline pass (or borderline fail) outcome. Thus, the installation location noise floor evaluation device 112 can also generate a borderline pass indication or a borderline fail indication to indicate that the noise floor 104 at the installation location 102 (or a portion 106 thereof) barely passes or barely fails the installation location noise floor evaluation test. It should be understood that this example is illustrative, and therefore should not be construed as being limiting in any way.

From operation 310, the process 300 can proceed to operation 314. The process 300 also can proceed to operation 314 from operation 312. The process 300 also can proceed to operation 314 from another operation for generating a borderline pass or borderline fail indication (not shown in FIG. 3), in which an indication could also be generated as illustrated and described herein. At operation 314, the installation location noise floor evaluation device 112 can output the indication generated in operations 310, 312, or other operations on a display 132 as illustrated and described above with reference to FIGS. 1-2. As illustrated and described above, the indication (e.g., the indication 134 illustrated and described herein) can be output on a digital display, on other types of displays (e.g., LEDs), or the like. Although not separately shown in FIG. 3, the installation location noise floor evaluation device 112 also can be configured to transmit the indication 134 to other entities such as a network operator, an installation technician, or the like. It should be understood that these examples are illustrative, and therefore should not be construed as being limiting in any way.

From operation 314, the process 300 can proceed to operation 316. The process 300 can end at operation 316.

As illustrated and described herein, the installation location noise floor evaluation device 112 can be designed to test only certain frequencies of RF signals 110. In particular, the RF frequencies being used by various connected home and/or burglar alarm systems (e.g., the device 138) can be very different relative to frequencies used for other RF applications such as cellular phones, WiFi, BLUETOOTH, and the like. According to various embodiments of the concepts and technologies disclosed herein, the frequencies that can be received by the antenna 126 and/or detected by the RF detector 128 are limited to the 315 MHz, 400-433 MHz, 863-870 MHz (EU ISM Band), and (902-915) MHz (US ISM Band) frequencies and/or frequency ranges. Thus, it can be appreciated that radio interfaces of other devices that may be configured to test certain aspects of RF signals are not capable of receiving and/or detecting the RF signals 110 illustrated and described herein, which are emitted specially in the above-mentioned frequencies and/or frequency ranges. As such, the installation location noise floor evaluation device 112 is not equivalent to or analogous to other RF frequency devices that operate in other frequencies as the functionality of the installation location noise floor evaluation device 112 illustrated and described herein cannot be performed by these devices.

As used herein, a borderline pass or borderline fail can be communicated to a user or other entity as a "conditional" pass or fail decision. This can mean that the device 138 can be installed and should generally function, but that spikes in the emission of RF signals 110 and/or the volume of those RF signals 110 may result in the device 138 not operating properly. Thus, the "conditional" pass or fail indication can communicate a borderline pass or fail that may prompt an entity (e.g., an installation technician) to install a repeater, move the device 138, and/or take other steps to mitigate the RF signals 110 to obtain a non-conditional (e.g., non-borderline) pass or fail indication. It should be understood that this example is illustrative, and therefore should not be construed as being limiting in any way.

As mentioned above, the pass, fail, or conditional indication can be transmitted via network connection to one or more other entities. In some embodiments, the pass, fail, or conditional indication can be transmitted via the network 140 to a network operator, an installation technician, a home or business owner, or other entity. Thus, the pass, fail, or conditional indication can be transmitted to inform various entities of the pass, fail, or conditional pass/fail determination and/or to prompt additional and/or alternative operations (e.g., cancelling installation, moving the device 138 to a different location, summoning more experienced personnel to install the device 138, or the like). It should be understood that these examples are illustrative, and therefore should not be construed as being limiting in any way.

Figure 4:
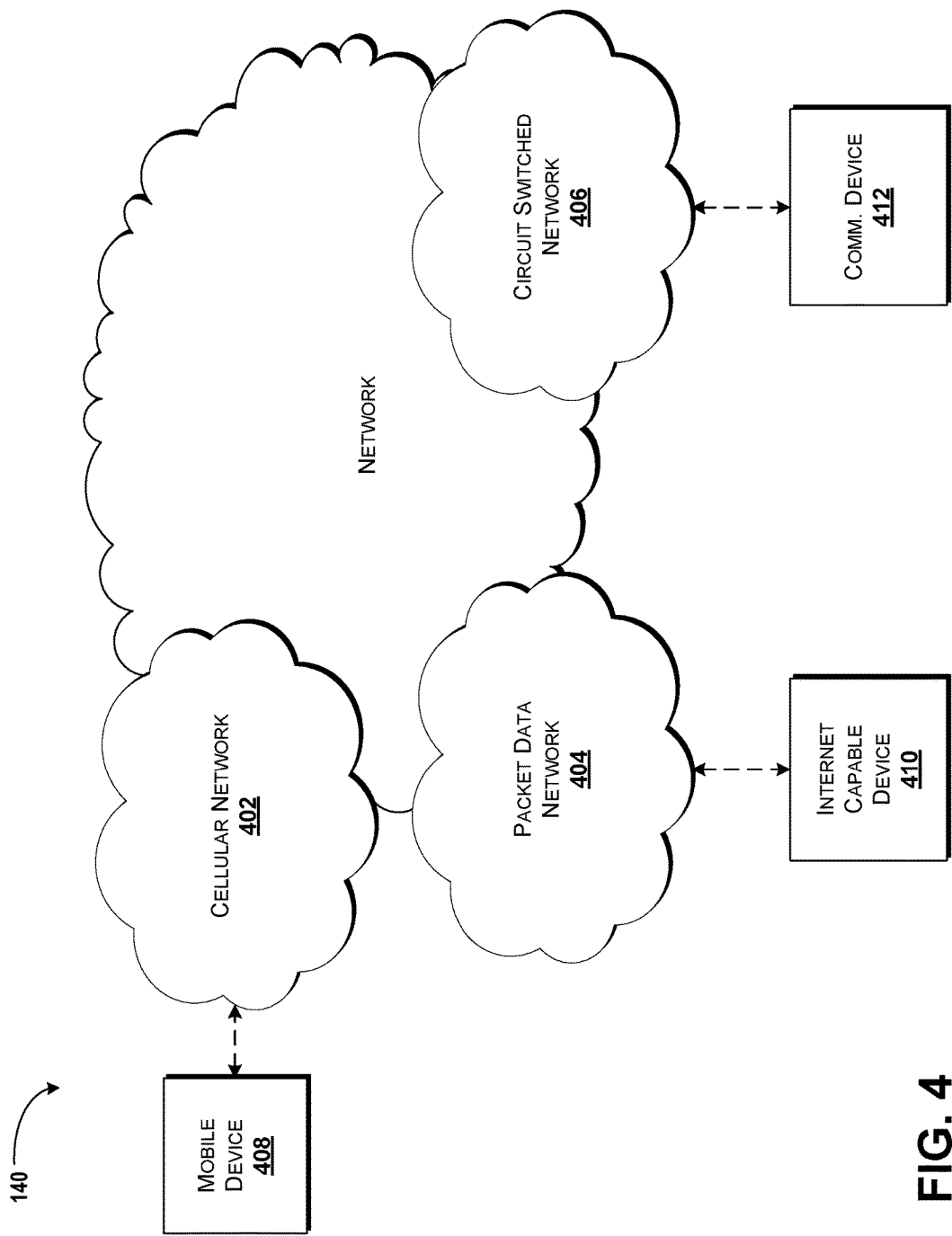
FIG. 4 schematically illustrates a network, according to an illustrative embodiment of the concepts and technologies described herein.

Turning now to FIG. 4, additional details of the network 140 are illustrated, according to an illustrative embodiment. The network 140 includes a cellular network 402, a packet data network 404, for example, the Internet, and a circuit switched network 406, for example, a publicly switched telephone network ("PSTN"). The cellular network 402 includes various components such as, but not limited to, base transceiver stations ("BTSs"), Node-B's or e-Node-B's, base station controllers ("BSCs"), radio network controllers ("RNCs"), mobile switching centers ("MSCs"), mobile management entities ("MMEs"), short message service centers ("SMSCs"), multimedia messaging service centers ("MMSCs"), home location registers ("HLRs"), home subscriber servers ("HSSs"), visitor location registers ("VLRs"), charging platforms, billing platforms, voicemail platforms, GPRS core network components, location service nodes, an IP Multimedia Subsystem ("IMS"), and the like. The cellular network 402 also includes radios and nodes for receiving and transmitting voice, data, and combinations thereof to and from radio transceivers, networks, the packet data network 404, and the circuit switched network 406.

A mobile communications device 408, such as, for example, a cellular telephone, a user equipment, a mobile terminal, a PDA, a laptop computer, a handheld computer, and combinations thereof, can be operatively connected to the cellular network 402. The cellular network 402 can be configured as a 2G GSM network and can provide data communications via GPRS and/or EDGE. Additionally, or alternatively, the cellular network 402 can be configured as a 3G UMTS network and can provide data communications via the HSPA protocol family, for example, HSDPA, EUL (also referred to as HSDPA), and HSPA+. The cellular network 402 also is compatible with 4G mobile communications standards as well as evolved and future mobile standards.

The packet data network 404 includes various devices, for example, servers, computers, databases, and other devices in communication with one another, as is generally known. The packet data network 404 devices are accessible via one or more network links. The servers often store various files that are provided to a requesting device such as, for example, a computer, a terminal, a smartphone, or the like. Typically, the requesting device includes software (a "browser") for executing a web page in a format readable by the browser or other software. Other files and/or data may be accessible via "links" in the retrieved files, as is generally known. In some embodiments, the packet data network 404 includes or is in communication with the Internet. The circuit switched network 406 includes various hardware and software for providing circuit switched communications. The circuit switched network 406 may include, or may be, what is often referred to as a plain old telephone system (POTS). The functionality of a circuit switched network 406 or other circuit-switched network are generally known and will not be described herein in detail.

The illustrated cellular network 402 is shown in communication with the packet data network 404 and a circuit switched network 406, though it should be appreciated that this is not necessarily the case. One or more Internet-capable devices 410, for example, a PC, a laptop, a portable device, or another suitable device, can communicate with one or more cellular networks 402, and devices connected thereto, through the packet data network 404. It also should be appreciated that the Internet-capable device 410 can communicate with the packet data network 404 through the circuit switched network 406, the cellular network 402, and/or via other networks (not illustrated).

As illustrated, a communications device 412, for example, a telephone, facsimile machine, modem, computer, or the like, can be in communication with the circuit switched network 406, and therethrough to the packet data network 404 and/or the cellular network 402. It should be appreciated that the communications device 412 can be an Internet-capable device, and can be substantially similar to the Internet-capable device 410. In the specification, the network 140 is used to refer broadly to any combination of the networks 402, 404, 406. It should be appreciated that substantially all of the functionality described with reference to the network 140 can be performed by the cellular network 402, the packet data network 404, and/or the circuit switched network 406, alone or in combination with other networks, network elements, and the like.

Figure 5:
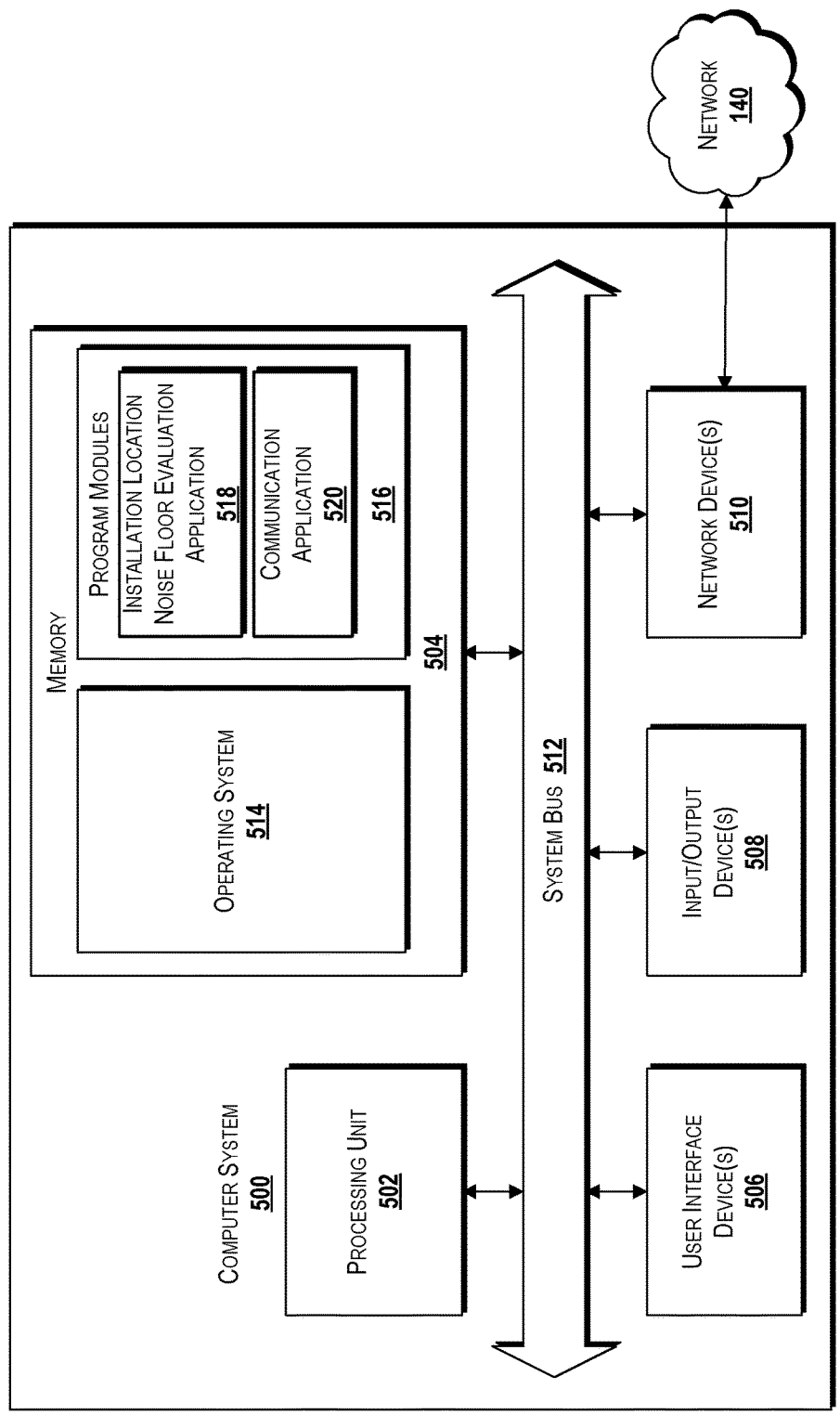
FIG. 5 is a block diagram illustrating an example computer system configured to provide the functionality of the installation location noise floor evaluation device, according to some illustrative embodiments of the concepts and technologies described herein.

FIG. 5 is a block diagram illustrating a computer system 500 that can be configured to provide the functionality described herein for an installation location noise floor evaluation device 112 in accordance with various embodiments of the concepts and technologies disclosed herein. The computer system 500 includes a processing unit 502, a memory 504, one or more user interface devices 506, one or more input/output ("I/O") devices 508, and one or more network devices 510, each of which is operatively connected to a system bus 512. The bus 512 enables bi-directional communication between the processing unit 502, the memory 504, the user interface devices 506, the I/O devices 508, and the network devices 510.

The processing unit 502 may be a standard central processor that performs arithmetic and logical operations, a more specific purpose programmable logic controller ("PLC"), a programmable gate array, or other type of processor known to those skilled in the art and suitable for controlling the operation of the server computer. As used herein, the word "processor" and/or the phrase "processing unit" when used with regard to any architecture or system can include multiple processors or processing units distributed across and/or operating in parallel in a single machine or in multiple machines. Furthermore, processors and/or processing units can be used to support virtual processing environments. Processors and processing units also can include state machines, application-specific integrated circuits ("ASICs"), combinations thereof, or the like. Because processors and/or processing units are generally known, the processors and processing units disclosed herein will not be described in further detail herein.

The memory 504 can include computer readable media as defined herein. The memory 504 can communicate with the processing unit 502 via the system bus 512. In some embodiments, the memory 504 is operatively connected to a memory controller (not shown) that enables communication with the processing unit 502 via the system bus 512. The memory 504 includes an operating system 514 and one or more program modules 516. The operating system 514 can include, but is not limited to, members of the WINDOWS, WINDOWS CE, and/or WINDOWS MOBILE families of operating systems from MICROSOFT CORPORATION, the LINUX family of operating systems, the SYMBIAN family of operating systems from SYMBIAN LIMITED, the BREW family of operating systems from QUALCOMM CORPORATION, the MAC OS, iOS, and/or LEOPARD families of operating systems from APPLE CORPORATION, the FREEBSD family of operating systems, the SOLARIS family of operating systems from ORACLE CORPORATION, other operating systems, and the like.

The program modules 516 may include various software and/or program modules described herein. In some embodiments, for example, the program modules 516 include an installation location noise floor evaluation application 518 and a communication application 520. The installation location noise floor evaluation application 518 and/or other programs can be embodied in computer-readable media containing instructions that, when executed by the processing unit 502, perform the process 300 described in detail above with respect to FIG. 3 and/or other functionality as illustrated and described herein. The communication application 520 can be executed by the computer system 500 to cause the computer system 500 to communicate an outcome of the installation location noise floor evaluation test to one or more entities via the network 140 and/or via other networks or connections.

It can be appreciated that, at least by virtue of the computer system 500 storing and/or executing the instructions embodying the process 300, and/or other functionality illustrated and described herein being stored in the memory 504 and/or accessed and/or executed by the processing unit 502, the computer system 500 is a special-purpose computing system that can facilitate providing the functionality illustrated and described herein. According to embodiments, the program modules 516 may be embodied in hardware, software, firmware, or any combination thereof. Although not shown in FIG. 5, it should be understood that the memory 504 also can be configured to store the thresholds 120, the indication 134, and/or other data, if desired.

By way of example, and not limitation, computer-readable media may include any available computer storage media or communication media that can be accessed by the computer system 500. Communication media includes computer-readable instructions, data structures, program modules, or other data in a modulated data signal such as a carrier wave or other transport mechanism and includes any delivery media. The term "modulated data signal" means a signal that has one or more of its characteristics changed or set in a manner as to encode information in the signal. By way of example, and not limitation, communication media includes wired media such as a wired network or direct-wired connection, and wireless media such as acoustic, RF, infrared and other wireless media. Combinations of the any of the above should also be included within the scope of computer-readable media.

Computer storage media includes volatile and non-volatile, removable and non-removable media implemented in any method or technology for storage of information such as computer-readable instructions, data structures, program modules, or other data. Computer storage media includes, but is not limited to, RAM, ROM, EPROM, EEPROM, flash memory or other solid state memory technology, CD-ROM, DVD, or other optical storage, magnetic cassettes, magnetic tape, magnetic disk storage or other magnetic storage devices, or any other medium which can be used to store the desired information and which can be accessed by the computer system 500. In the claims, the phrase "computer storage medium" when used in the context of a computer such as the computer system 500 also does not include waves or signals per se and/or communication media as defined herein.

The user interface devices 506 may include one or more devices with which a user accesses the computer system 500. The user interface devices 506 may include, but are not limited to, computers, servers, personal digital assistants, cellular phones, or any suitable computing devices. The I/O devices 508 enable a user to interface with the program modules 516. In one embodiment, the I/O devices 508 are operatively connected to an I/O controller (not shown) that enables communication with the processing unit 502 via the system bus 512. The I/O devices 508 may include one or more input devices, such as, but not limited to, a keyboard, a mouse, or an electronic stylus. Further, the I/O devices 508 may include one or more output devices, such as, but not limited to, a display screen or a printer.

The network devices 510 enable the computer system 500 to communicate with other networks or remote systems via a network, such as the network 140. Examples of the network devices 510 include, but are not limited to, a modem, a radio frequency ("RF") or infrared ("IR") transceiver, a telephonic interface, a bridge, a router, or a network card. The network 140 may include a wireless network such as, but not limited to, a Wireless Local Area Network ("WLAN") such as a WI-FI network, a Wireless Wide Area Network ("WWAN"), a Wireless Personal Area Network ("WPAN") such as BLUETOOTH, a Wireless Metropolitan Area Network ("WMAN") such a WiMAX network, or a cellular network. Alternatively, the network 140 may be a wired network such as, but not limited to, a Wide Area Network ("WAN") such as the Internet, a Local Area Network ("LAN") such as the Ethernet, a wired Personal Area Network ("PAN"), or a wired Metropolitan Area Network ("MAN").

Although not separately illustrated in FIG. 5, it should be understood that the computer system 500 can also include the adjustable circuit 122 or a software control for providing the functionality illustrated and described herein with respect to the adjustable circuit 122; the gain control 124; the antenna 126; the RF detector 128; the switch 130; the display 132; and the other hardware 136. As such, it can be appreciated that the computer system 500 can provide the functionality of the installation location noise floor evaluation device 112 illustrated and described herein via hardware and/or software. It should be understood that this example is illustrative, and therefore should not be construed as being limiting in any way.

Based on the foregoing, it should be appreciated that an installation location noise floor evaluation device has been disclosed herein. Although the subject matter presented herein has been described in language specific to computer structural features, methodological and transformative acts, specific computing machinery, and computer-readable media, it is to be understood that the concepts and technologies disclosed herein are not necessarily limited to the specific features, acts, or media described herein. Rather, the specific features, acts and mediums are disclosed as example forms of implementing the concepts and technologies disclosed herein.

The subject matter described above is provided by way of illustration only and should not be construed as limiting. Various modifications and changes may be made to the subject matter described herein without following the example embodiments and applications illustrated and described, and without departing from the true spirit and scope of the embodiments of the concepts and technologies disclosed herein.

The invention claimed is:

1. A noise floor evaluation device comprising:
a housing;
a first light emitting diode located at the housing, wherein the first light emitting diode corresponds, if activated, to a pass indication;
a second light emitting diode located at the housing, wherein the second light emitting diode corresponds, if activated, to a conditional pass indication;
a third light emitting diode located at the housing, wherein the third light emitting diode corresponds, if activated, to a fail indication;
an antenna located at the housing;
a radio frequency detector located at the housing; and
a processing component located in the housing, wherein the processing component is configured to cause the noise floor evaluation device to perform operations comprising:
receiving, via the antenna, a radio frequency signal emitted by a radio frequency device that emits the radio frequency signal into an installation location,
detecting, via the radio frequency detector, a radio frequency noise floor associated with the installation location based on the radio frequency signal,
comparing, by the processing component, the radio frequency noise floor to a noise floor threshold associated with an operating frequency of a device to be installed at the installation location,
if a first determination is made that the radio frequency noise floor does not exceed a first noise floor threshold, activating the first light emitting diode,
if a second determination is made, by the processing component, that the radio frequency noise floor exceeds a second noise floor threshold but does not exceed the first noise floor threshold, activating the second light emitting diode, and
if a third determination is made, by the processing component, that the radio frequency noise floor exceeds the first noise floor threshold, activating the third light emitting diode.

2. The noise floor evaluation device of claim 1, further comprising a switch that sets a frequency range detected by the noise floor evaluation device, wherein selection of the switch causes a power source to supply power to the processing component.

3. The noise floor evaluation device of claim 1, wherein comparing the radio frequency noise floor to the noise floor threshold comprises determining that the radio frequency noise floor exceeds the noise floor threshold by a defined amount, and outputting an indication of borderline compliance.

4. The noise floor evaluation device of claim 1, wherein the operations further comprise generating, by the processing component, an indication that indicates an outcome of the comparing, wherein generating the indication comprises:
generating the pass indication if the first determination is made that the radio frequency noise floor does not exceed the first noise floor threshold;
generating the conditional pass indication if the second determination is made that the radio frequency noise floor exceeds the second noise floor threshold but does not exceed the first noise floor threshold; and
generating a fail indication if the third determination is made that the radio frequency noise floor exceeds the first noise floor threshold.

5. The noise floor evaluation device of claim 1, further comprising a switch located at the housing, wherein the switch has four positions, wherein the switch sets a frequency range detected by the noise floor evaluation device, and wherein:
a first position of the four positions corresponds to a first frequency range comprising 315 MHz;
a second position of the four positions corresponds to a second frequency range comprising 400-433 MHz;
a third position of the four positions corresponds to a third frequency range comprising 863-870 MHz; and
a fourth position of the four positions corresponds to a fourth frequency range comprising 902-928 MHz.

6. The noise floor evaluation device of claim 1, further comprising an adjustable circuit, wherein the processing component is configured to cause the device to perform the operations further comprising setting the noise floor threshold based on a position of the adjustable circuit.

7. A noise floor evaluation device comprising:
a housing;
a display located at the housing, the display comprising three light emitting diodes comprising a first light emitting diode that corresponds, if activated, to a pass indication, a second light emitting diode that corresponds, if activated, to a conditional pass indication, and a third light emitting diode that corresponds, if activated, to a fail indication;
an antenna located at the housing;
a radio frequency detector located at the housing; and
a processing component located in the housing, wherein the processing component is configured to cause the noise floor evaluation device to perform operations comprising:
receiving, via the antenna, a radio frequency signal emitted by a radio frequency device that emits the radio frequency signal into an installation location,
detecting, via the radio frequency detector, a radio frequency noise floor associated with the installation location based on the radio frequency signal,
comparing, by the processing component, the radio frequency noise floor to a noise floor threshold associated with an operating frequency of a device to be installed at the installation location, if a first determination is made that the radio frequency noise floor does not exceed a first noise floor threshold,
generating, by the processing component, the pass indication, and
activating the first light emitting diode,
if a second determination is made, by the processing component, that the radio frequency noise floor exceeds a second noise floor threshold but does not exceed the first noise floor threshold,
generating the conditional pass indication, and
activating the second light emitting diode, and
if a third determination is made, by the processing component, that the radio frequency noise floor exceeds the first noise floor threshold,
generating a fail indication, and
activating the third light emitting diode.

8. The noise floor evaluation device of claim 7, further comprising a button, wherein selection of the button causes a power source to supply power to the processing component.

9. The noise floor evaluation device of claim 7, further comprising an adjustable circuit, wherein the processing component is configured to cause the device to perform the operations further comprising setting the noise floor threshold based on a position of the adjustable circuit.

10. The noise floor evaluation device of claim 7, wherein the processing component is further configured to cause the noise floor evaluation device to perform operations further comprising:
detecting a request to perform an installation location noise floor evaluation test.

11. The noise floor evaluation device of claim 10, further comprising a button, wherein detecting the request comprises detecting selection of the button, and wherein selection of the button causes a power source to supply power to the processing component.

12. The noise floor evaluation device of claim 10, further comprising a switch that sets a frequency range detected by the noise floor evaluation device, wherein detecting the request comprises detecting selection of the switch, and wherein selection of the switch causes a power source to supply power to the processing component.

13. The noise floor evaluation device of claim 7, further comprising a switch located at the housing, wherein the switch has four positions, wherein the switch sets a frequency range detected by the noise floor evaluation device, and wherein:
a first position of the four positions corresponds to a first frequency range comprising 315 MHz;
a second position of the four positions corresponds to a second frequency range comprising 400-433 MHz;
a third position of the four positions corresponds to a third frequency range comprising 863-870 MHz; and
a fourth position of the four positions corresponds to a fourth frequency range comprising 902-928 MHz.

14. The noise floor evaluation device of claim 7, wherein the device comprises a burglar alarm component.

15. A noise floor evaluation device comprising:
a housing;
a display located at the housing, the display consisting of three light emitting diodes comprising a first light emitting diode that corresponds, if activated, to a pass indication, a second light emitting diode that corresponds, if activated, to a conditional pass indication, and a third light emitting diode that corresponds, if activated, to a fail indication
an antenna located at the housing;
a radio frequency detector located at the housing;
a processor located in the housing; and
a memory that stores computer-executable instructions that, when executed by the processor, cause the noise floor evaluation device to perform operations comprising
receiving, via the antenna, a radio frequency signal emitted by a radio frequency device that emits the radio frequency signal into an installation location,
detecting, via the radio frequency detector, a radio frequency noise floor associated with the installation location based on the radio frequency signal,
comparing the radio frequency noise floor to a noise floor threshold associated with an operating frequency of a device to be installed at the installation location,
if a first determination is made that the radio frequency noise floor does not exceed a first noise floor threshold,
generating the pass indication, and
activating the first light emitting diode
if a second determination is made, that the radio frequency noise floor exceeds a second noise floor threshold but does not exceed the first noise floor threshold,
generating the conditional pass indication, and
activating the second light emitting diode, and
if a third determination is made that the radio frequency noise floor exceeds the first noise floor threshold,
generating a fail indication, and
activating the third light emitting diode.

16. The noise floor evaluation device of claim 15, further comprising a switch located at the housing, wherein the switch has four positions, wherein the switch sets a frequency range detected by the noise floor evaluation device, and wherein:
a first position of the four positions corresponds to a first frequency range comprising 315 MHz;
a second position of the four positions corresponds to a second frequency range comprising 400-433 MHz;
a third position of the four positions corresponds to a third frequency range comprising 863-870 MHz; and
a fourth position of the four positions corresponds to a fourth frequency range comprising 902-928 MHz.

17. The noise floor evaluation device of claim 15, wherein the computer-executable instructions, when executed by the processor, cause the noise floor evaluation device to perform operations further comprising:
detecting a request to perform an installation location noise floor evaluation test.

18. The noise floor evaluation device of claim 17, wherein the device comprises a burglar alarm component.

19. The noise floor evaluation device of claim 17, further comprising a button, wherein detecting the request comprises detecting selection of the button, and wherein selection of the button causes a power source to supply power to the processor.

20. The noise floor evaluation device of claim 17, further comprising a switch that sets a frequency range detected by the noise floor evaluation device, wherein detecting the request comprises detecting selection of the switch, and wherein selection of the switch causes a power source to supply power to the processor.

* * * * *